United States Patent [19]

Masiewicz

[11] Patent Number: 5,632,019

[45] Date of Patent: May 20, 1997

[54] OUTPUT BUFFER WITH DIGITALLY CONTROLLED POWER HANDLING CHARACTERISTICS

[75] Inventor: John C. Masiewicz, San Jose, Calif.

[73] Assignee: Seagate Technology, Inc., Scotts Valley, Calif.

[21] Appl. No.: 276,091

[22] Filed: Jul. 15, 1994

[51] Int. Cl.$^6$ .................................................. G06F 13/10
[52] U.S. Cl. .................................... 395/250; 395/883
[58] Field of Search ................................ 395/250, 883

[56] References Cited

U.S. PATENT DOCUMENTS

| 5,157,282 | 10/1992 | Ong et al. | 307/443 |
| 5,261,057 | 11/1993 | Coyle et al. | 395/275 |

*Primary Examiner*—Krisna Lim
*Attorney, Agent, or Firm*—Flehr Hohbach Test Albritton & Herbert LLP

[57] ABSTRACT

A programmable output buffer has source/sink characteristics that may be programmed to match the capacitive load to be driven. The programmable output buffer comprises a plurality of individually-enableable unit buffers, and a programmable unit buffer driver control logic. By programming the control logic to enable only such unit buffers whose current handling contributions are necessary to drive the output buffer load capacitance, current spiking can be minimized. The unit buffers preferably are scaled so each can source or sink a different magnitude current relative to the other unit buffers, a range of output buffer current may be programmed in discrete current steps. The control logic preferably includes elements that delay delivery of an enabling signal to various of the unit buffers. In a cascade-up mode, the control logic sequentially delays enabling signals so that various of the required unit buffers are enabled sequentially, to minimize problems associated with current spiking. In a cascade-down mode, the unit buffers are simultaneously enabled but are sequentially disabled. A mode encompassing cascade-up and cascade-down mode operation is provided, as is a mode wherein the sequence of cascade-on and/or cascade-off enabling signals is retriggered for every data change. This mode permits changing data in the buffer without creating current spikes that would result if the data were changed while the unit buffers were enabled.

20 Claims, 10 Drawing Sheets

OUTPUT BUFFER WITH DIGITALLY CONTROLLED POWER HANDLING CHARACTERISTICS

FIELD OF THE INVENTION

This invention relates to digital integrated circuits such as output buffers, and more particularly to output buffers having programmable power handling characteristics.

BACKGROUND OF THE INVENTION

Output buffers are integrated circuits ("ICs") used to interface a digital input signal to a typically large capacitive and/or resistive load that is often a system buss or an interconnect cable. Many output buffers include an enabling function whereby the buffer input signal appears as the buffer output only when an enabling signal is present.

FIG. 1A depicts generically such an output buffer 2, which typically operates from an upper power supply Vdd and a lower power supply Vss that is often ground. The buffer receives DATA IN as an input and outputs a DATA OUTPUT signal, providing the OUTPUT ENABLE signal is present (e.g., is a digital "1"). Depending upon the circuit design, DATA OUTPUT may replicate or be an inverted version of DATA IN, and the buffer may enable with the OUTPUT ENABLE is a digital "0". The output of buffer 2 is shown coupled to a load impedance $Z_L$ that may be represented generally by a resistance $R_L$ shunted by an effective capacitive load $C_L$. Load impedance $Z_L$ typically represents a long buss, or perhaps a signal cable of many meters lengths. In some applications, $Z_L$ may be primarily a load resistance e.g., $R_L$, or a load capacitance $C_L$, or a combination of each.

As shown in FIG. 1A, buffer 2 may be implemented with bipolar transistors, complementary metal-on-semiconductor ("CMOS") transistors, or a combination of each ("Bi-CMOS"). Buffer 2 typically will include two inverters I1 (here a NAND gate) and I2 coupled in series, or I3 (here a NOR gate) and I2 coupled in series. The output of the first inverter is presented as input to the second inverter, and the output of the second inverter is the buffer output, which has the same phase as the input to the first inverter. In the CMOS implementation of FIG. 1A, each inverter comprises a P-type pull-up metal-on-semiconductor ("PMOS") transistor and an N-type MOS ("NMOS") transistor coupled in series between Vdd and Vss. For example, I1 may comprise a PMOS transistor P1 (not shown) and an NMOS transistor N1 (not shown), I2 comprises PMOS transistor P2 and NMOS transistor N2, and I3 comprises transistors P3, N3 (not shown). Because I2 drives load $Z_L$, output transistors P2 and N2 will generally be larger sized devices than the transistors comprising I1 or I3.

The enabling function may be implemented using the NAND gate (I1), INVERTER and NOR gate (I3) logic shown, or using other techniques well known to those skilled in the relevant art.

When DATA IN is a digital "1", within I1, P1 turns off and N1 turns on, and the first inverter output is a digital "0". Upon receipt of this "0", in the second inverter I2, P2 turns on, N2 turns off, and the DATA OUTPUT will be a digital "1", and buffer 2 sources current into $Z_L$. When DATA IN is a digital "0", P1 turns on, N1 turns off, and the output from the first inverter is a "1". Upon receipt of this "1", P2 in the second inverter turns off, N2 turns on, DATA OUTPUT is a "0", and buffer 2 sinks current from $Z_L$.

FIG. 1B depicts voltage and current waveforms associated with output buffer 2. For example, although DATA IN is "1" before time $t_0$, it is only after the OUTPUT ENABLE signal goes high that buffer 2 is enabled to provide the DATA OUTPUT signal. At time $t_1$, DATA IN goes low and, since OUTPUT ENABLE is still enabling buffer 2, the DATA OUTPUT signal also goes low. In the DATA OUT waveform, the voltage waveform drawn in phantom represents the case of a relatively large load capacitance $C_L$. When $C_L$ is not especially large, the output voltage waveform slews more rapidly, but can ovrshoot and undershoot as shown.

It is thus appreciated from the DATA OUT waveform that as $C_L$ increases, the output voltage slew rate (dV/dt) decreases. To compensate for this, it is necessary to implement buffer 2 with larger output inverter transistors, e.g., transistors that can source or sink more current (i). (Of course, this assumes that the IC containing buffer 2 has sufficient area whereon to fabricate larger transistors.) The ability to compensate for a large $C_L$ by increasing output buffer current follows from the equation:

$i = C_L dV/dt$

Although large current handling transistors can improve output voltage slewrate, a large current capability can be detrimental. In practice, buffer 2 will not function perfectly because the various pull-up and pull-down transistors do not change states in perfect synchronism. The output buffer current waveform depicts the total current $i_o$ flowing through buffer 2. The $i_o$ current wave form drawn in phantom represents total current drawn by the buffer when the various buffer transistors are themselves large devices, e.g., devices with a relatively large drain current.

Note from this waveform that current spikes occur when the buffer transistors change states, for example at times To and $t_1$. These spikes are created because for a brief moment, the PMOS and NMOS transistors in each inverter are simultaneously on, thus presenting a low impedance current path between the Vdd and Vss power supplies. In addition, current spiking occurs because the load capacitance $C_L$ component of $Z_L$ is being charged toward Vdd or discharged toward Vss (depending upon the direction of the output state change).

Thus, the $i_o$ waveform in FIG. 1B suggests that compensating for a large load capacitance $C_L$ by implementing buffer 2 with large current transistors will aggravate current spiking. Those skilled in the art will appreciate that the current spiking waveforms can contain many high frequency components that represent electromagnetic ("EM") and radio frequency ("RF") noise that can interfere with other signals implemented on the IC containing buffer 2, and with signals elsewhere in a system contain this IC.

The current spiking can also contribute to crosstalk between various signal lines on a system including the output buffer, and can also contribute to unwanted transmission line reflections. Further, current spiking represents transient bursts of heat that must be safely dissipated by the transistors within buffer 2.

If $C_L$ were reliably known, an output buffer comprising suitably sized transistors might be readily designed and implemented. However, in so doing, existing standard buffer circuit fabrication may have to be substantially revised, especially where significantly greater output current must now be sourced/sinked. Similarly, in some applications if the magnitude of $R_L$ were known, the output buffer could be suitable designed. For example, in an application wherein DC current flow occurs, knowledge of the magnitude of $R_L$ would permit sizing the output transistors within the buffer.

Further, in some system applications, the magnitude of $C_L$ and/or $R_L$ may not be known a priori. For example, in FIG.

2A, the host computer 4 in a computer system may be coupled to one, two or N hard disc drive units 6, wherein the host computer-disc drive interface includes an output buffer 2, such as depicted in FIG. 1A.

In FIG. 2A, if the output buffer were designed to source/sink current representing N hard disc drive loads, the output buffer will source/sink excessive current when fewer than N loads are coupled to the host computer. When driving less than N loads, the excessive current would improve the output voltage slew rate, but would also increase the magnitude of the current spikes during transition, as well as the transient heat required to be dissipated by the buffer transistors. On the other hand, if the output buffer were designed to source/sink current representing four loads, then the buffer voltage slewrate would be impermissibly slow if more than four loads were to be driven. See, for example, the DATA OUT phantom waveform shown in FIG. 1B depicting a slow voltage slewrate.

FIG. 2B depicts another system application wherein a hard disc drive unit 6 may be required to provide data to one or more host computers 4 that are coupled to the disc drive output buffer 2 through different lengths of cable. The result is that the output buffer 2 may be coupled to a nominal effective load capacitance $C_L$, or to a substantially different magnitude load capacitance, depending perhaps on the length of cable separating the host from the buffer. Optimizing the output buffer to drive a nominal value $C_L$ may represent a poor design choice when driving a substantially different capacitive load.

While FIGS. 2A and 2B demonstrate the problem of providing a suitably designed output buffer between one or more host computers and one or more hard disc drive units, the problem can exist in other environments as well.

Thus, there is a need for a generic output buffer that may be implemented using existing fabrication designs, and whose output source/sink current may be readily modified according to the capacitive load to be driven. To help reduce system noise, such output buffer preferably should include a mechanism for reducing noise spikes.

The present invention discloses such an output buffer.

SUMMARY OF THE PRESENT INVENTION

A programmable output buffer suitable for use in interfacing host computers and hard disc drives units (among other applications) has programmable current source/sink characteristics that may be matched to the capacitive load to be driven. The programmable output buffer comprises a plurality of unit buffers that may be enabled individually, and a programmable unit buffer driver control logic. By programming the control logic to enable only such unit buffers whose current handling contributions are necessary to drive the output buffer load capacitance, current spiking is minimized.

By scaling the unit buffers such that each can source or sink a different magnitude current relative to the other unit buffers, a range of output buffer current may be programmed in discrete current steps. For example, a hard disc drive unit may thus include an output buffer that is programmed to source/sink more current when outputting data over a long cable to a host computer than when outputting data over a short cable, In this example, the same output buffer is provided for a variety of hard discs, with the buffer current characteristics programmed to suit the application at hand. Alternatively, an output buffer may be required to drive one or multiple loads simultaneously. By suitably programming the buffer current characteristics, source/sink output current could be made to accommodate the number of loads coupled to the output buffer.

In a second aspect, the control logic preferably includes elements that delay delivery of an enabling signal to various of the unit buffers. In a cascade-up mode, the control logic delays the enabling signals such that when the load capacitance requires use of more than one unit buffer, the unit buffers to be used are enabled sequentially. By thus enabling first one unit buffer and after a brief delay, the next unit buffer, and so on, current spiking is further diminished. In a cascade-down mode, the unit buffers used are simultaneously enabled, which permits rapid onset of current sourcing or sinking, but are sequentially disabled. If required, a suitable control logic can command simultaneous cascade-up and cascade-down mode operation.

The control logic preferably can retrigger the sequence of cascade-on and/or cascade-off enabling signals to the unit buffers for every data change. This mode permits changing data in the buffer without creating current spikes that would result if the data were changed while the unit buffers were enabled.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 3A:
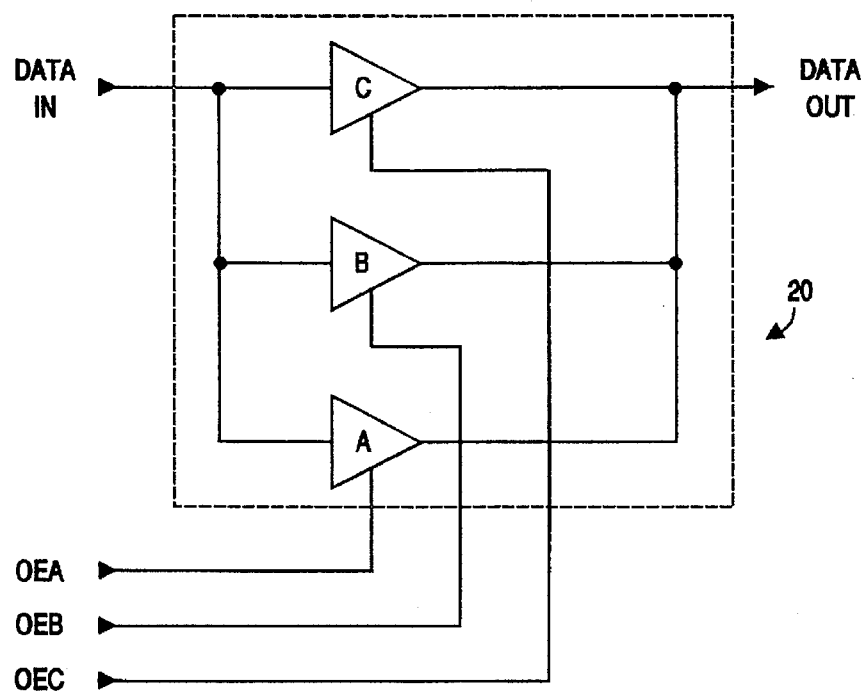
FIG. 3A is a block diagram of an output buffer with programmable drive current, according to the present invention.

FIG. 3A depicts a programmable output buffer 20 according to the present invention as comprising a plurality of preferably conventionally designed and fabricated unit buffers A, B, and C, although more or fewer than three individual buffers depicted may be used. In a preferred embodiment, buffer A has output transistors that can source/sink $i_A$=X mA of current, whereas buffer B has output transistors that can source/sink $i_B$=2X mA of current, and buffer C has output transistors that can source/sink $i_C$=3X mA of current. In a typical application, X may be 4, such that unit buffers A, B, C respectively can source/sink 4 mA, 8 mA, 12 mA of current. The source/sink capability $i_o$ of the output buffer 20 at a given time will be the current sum of whichever of unit buffers A, B and C are activated at that time.

These respective current handling capabilities may be implemented by providing buffer B with output transistors whose gate width by length ratio ("WxL") for CMOS implementation is twice that of the transistors in buffer A, whereas buffer C can have transistors with three times the WxL ratio of the transistors in buffer A.

Figure 3B:
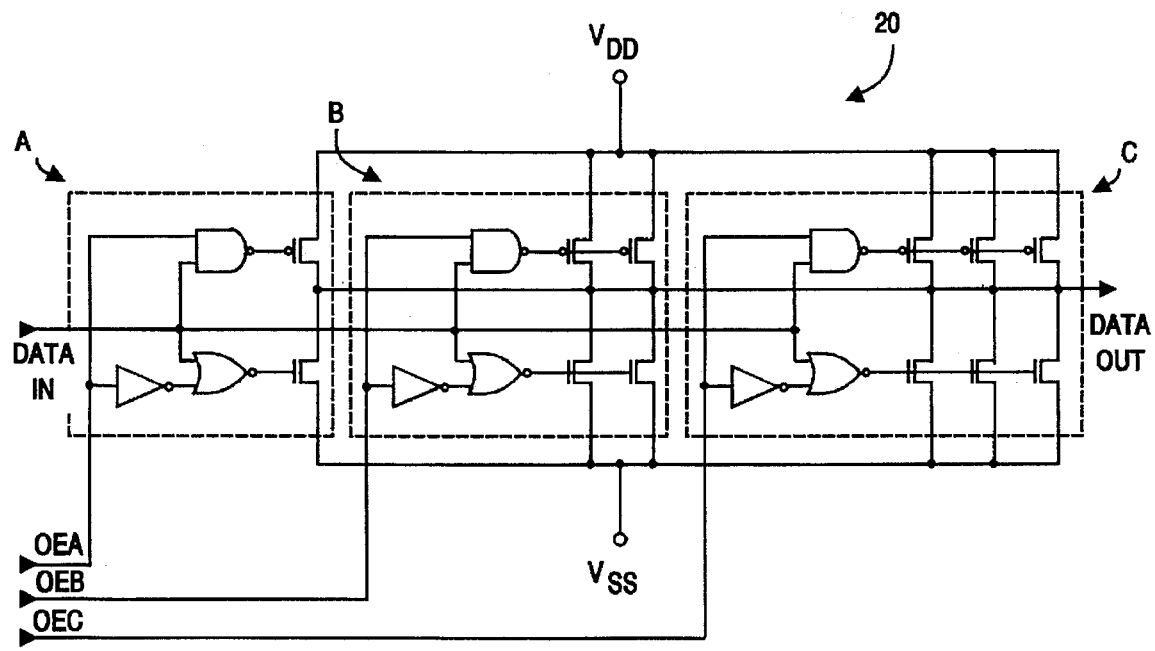
FIG. 3B is a schematic of an output buffer with programmable drive current obtaining by enabling parallel-coupled output transistors, according to the present invention.

FIG. 3B shows an alternate embodiment of a buffer 20, wherein unit buffer B comprises two parallel-coupled pairs of output transistors, and wherein unit buffer C comprises three parallel-coupled pairs of output transistors. Each of the output transistors may be substantially identical in size, although they need not be, and different numbers of transistor pairs may be parallel-coupled in the unit buffers. The output characteristics of buffer 20 are determined by the enabling signals OEA, OEB, OEC. In this embodiment, the parallel-coupled transistors "sum" to the desired source/sink capability for buffer 20.

In FIGS. 3A and 3B, unit buffers A, B, and C respectively are enabled by OUTPUT ENABLE signals OEA, OEB and OEC. TABLE 1, below, shows that programmable sink/source current $i_o$ may be dynamically reconfigured to be 1X, 2X, 3X, 4X, 5X or 6X mA. When programmable buffer 20 is used in an interface between host computers and hard disc drive units, X preferably will be in the approximately 4 mA range. Thus, as shown by TABLE 1, programmable buffer 20 can be made to source/sink 4 mA to 24 mA in increments of 4 mA. Of course other increment levels could be provided by using more than three buffers A, B, C, and/or by providing different current scaling between the various buffer units.

TABLE 1

| $i_o$ | OEC | OEB | OEA |
|---|---|---|---|
| X | 0 | 0 | 1 |
| 2X | 0 | 1 | 0 |
| 3X | 1 | 0 | 0 |
| 4X | 1 | 0 | 1 |
| 5X | 1 | 1 | 0 |
| 6X | 1 | 1 | 1 |

Figure 4:
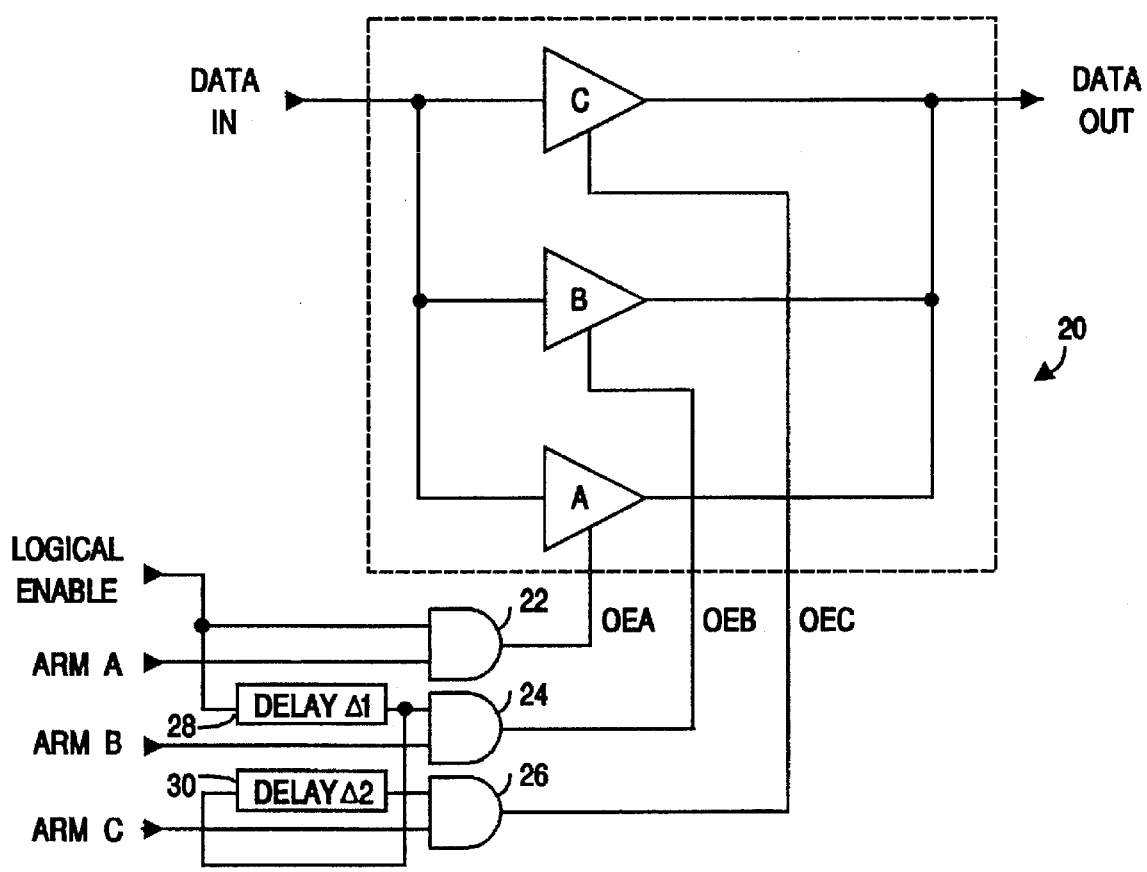
FIG. 4 is a block diagram of an output buffer with programmable drive current and programmable turn-on, turn-off characteristics to reduce current spiking, according to the present invention.

The embodiment of FIG. 4 provides the ability to reduce current spiking by spatially delaying turn-on and turn-off of various of the unit buffers, e.g., buffer B and buffer C. In FIG. 4, output buffer 20 includes logic AND gates 22, 24, 26 and time delay elements 28 and 30. The time delay elements simply receive an input pulse, delay it for a time ΔT and then output the delayed pulse. The magnitude of the delay will depend upon the implementation of the output buffer, but for CMOS devices, the delay may typically be on the order of a few nanoseconds, or so.

The implementation of such delay elements is known to those skilled in the art, and may include, for example, shift registers, one-shots, delay lines and the like. In FIG. 4, ARM A, ARM B and ARM C are signals that can cause unit buffers A, B and C respectively to contribute to the overall current sourced and sunk by output buffer 20. However, none of the unit buffers A, B, C will be enabled unless an OUTPUT ENABLE signal is received by that buffer.

As will now be described, the AND gates and delay elements permit reduce current spiking by spatially delaying a unit buffer's receipt of the OUTPUT ENABLE signal. Assume that output buffer 20 is configured to source/sink maximum current, which means that unit buffers A, B and C will be used. If each unit buffer were simultaneously turned on or off, severe current spiking could readily result.

However, in FIG. 4 upon receipt of ARM A="1" and LOGICAL ENABLE="1", unit buffer A is enabled. Assuming that unit buffers A, B, C are scaled as was described with respect to TABLE 1 and that X=4 mA, with only unit buffer A enabled, output buffer 20 can only source or sink 4 mA. Because, in this example, all three unit buffers are required, ARM B and ARM C will also be high.

However receipt of the enabling LOGICAL ENABLE signal by unit buffer B will be delayed by delay element 28 for a time Δ1. Thus, after this time delay, output buffer 20 will comprise unit buffer A and B, and can source/sink 4 mA+8 mA or 12 mA current. After an additional time delay Δ2 caused by delay element 30, unit buffer C will be enabled, whereupon output buffer 20 will be able to source/sink 4 mA+8 mA+12 mA=24 mA. This sequential turning-on of the unit buffers will be referred to as cascading on. In this fashion, output buffer 20 "stair-steps" up to the maximum source/sink current capability.

By time delaying the onset of the maximum current capability, a single short duration large amplitude current spike containing many high frequency components is replaced by several smaller current spikes containing fewer high frequency components that occur over Δ1 plus Δ2. If desired, a cascade-off sequence could be implemented instead of, or in addition to, the above-described cascade-on mode of operation.

In a cascade-off sequence, the unit buffers may all be turned-on simultaneously, but are turned-off sequentially. A simultaneous turn-on of all unit buffers would source/sink the maximum amount of current, and would ensure a rapid initial charge or discharge of the load capacitance, analogous to "kick-starting" a vehicle. A mode wherein all unit buffers are off after an initial "kick-start" is especially applicable for use with conventional "wired-OR" circuits, wherein pull-up or pull-down resistors are employed. Such circuits are well known to those skilled in the relevant art.

In a cascade-off mode, rather than have the respective OEA, OEB, OEC unit buffer enabling signals all go low simultaneously, OEA might first go low, then after a time delay OEB could go low, and after an additional time delay, OEC would go low. Of course, other turn-off sequences are possible, and indeed an embodiment could include both cascade-on and cascade-off sequencing of the unit buffers.

The embodiment of FIG. 4 is intended solely for illustration, and other schemes for reducing current spiking by sequentially activating the unit buffers A, B, C may be used. In some applications, it may be desirable to use time delay elements for each unit buffer, and/or to make some or all of the delay elements variable in delay. If desired, a feedback mechanism could sense the relative magnitude of load capacitance coupled to the output of the output buffer 20, and activate ARM A, ARM B, ARM C and/or program the time delay elements appropriately.

Figure 5:
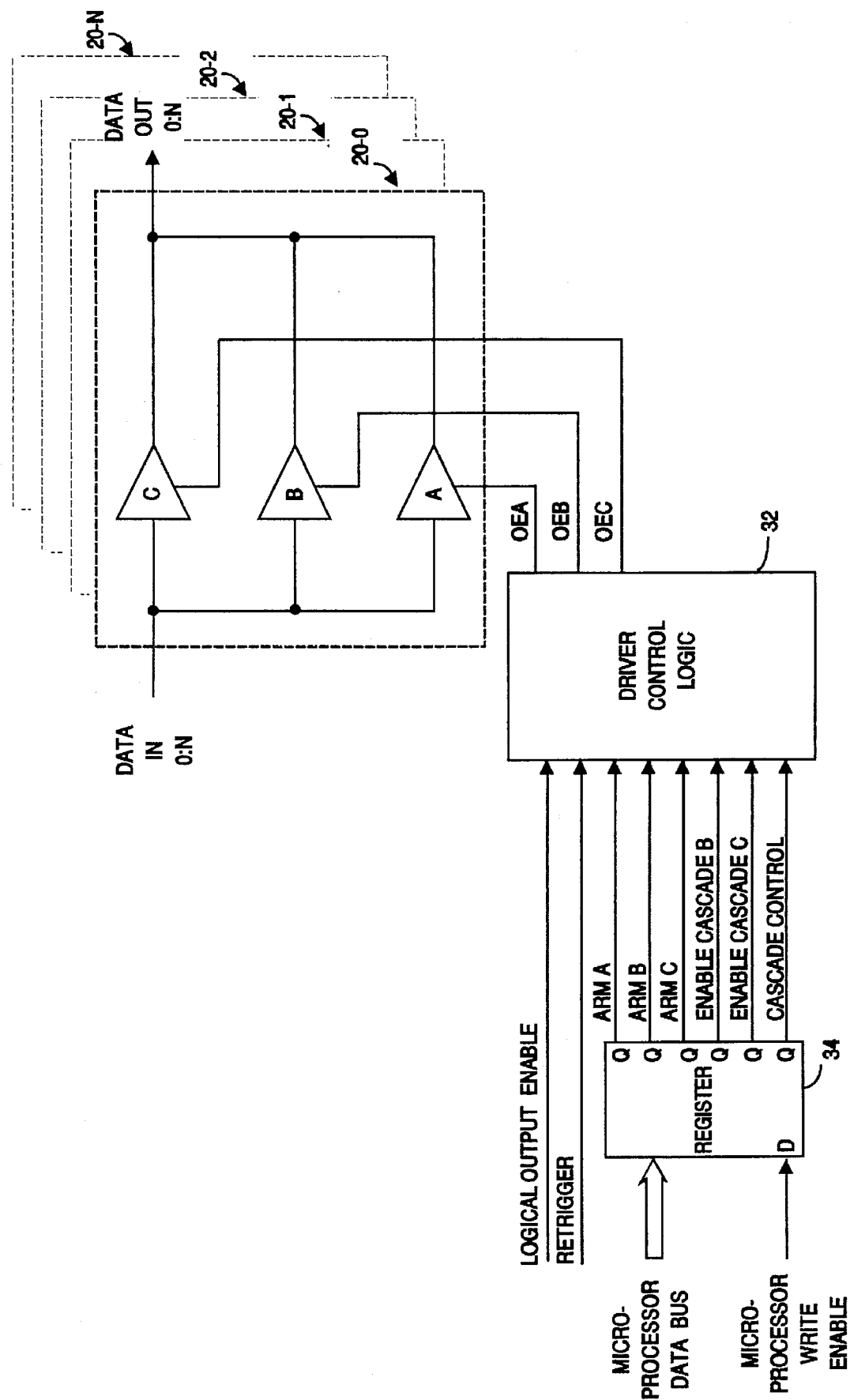
FIG. 5 is a block diagram a programmable multi-bit output buffer, showing control logic and initialization system configuration, according to the present invention.

FIG. 5 shows a multi-bit output buffer that comprises single-bit output buffers 20-0 (which receives and outputs bit 0), 20-1 (which receives and outputs bit 1), . . . 20-N (which receives and outputs bit N). A driver control logic module 32 (depicted in FIG. 6) receives system-level LOGICAL OUTPUT ENABLE and RETRIGGER signals, as well as ARM A, ARM B, ARM C, ENABLE CASCADE B, ENABLE CASCADE C and CASCADE CONTROL signals from a register 34. Register 34 is coupled to receive as input a microprocessor WRITE ENABLE and DATA BUS signals. In response to the output from register 34, the driver control logic module 32 outputs the appropriate OEA, OEB, OEC enabling signals to the unit buffers A, B, C. It is to be understood that the various output buffers 20-x (0≦x≦N) may in fact include more or fewer than three unit buffers A, B and C.

As shown by FIG. 5, the present invention advantageously permits a single driver control logic unit 32 to control N output buffers 20-x.

The function of the LOGICAL OUTPUT ENABLE, ARM A, ARM B, ARM C input signals to driver control logic 32 has already been explained. The ENABLE CASCADE B and ENABLE CASCADE C control signals invoke the cascade turn-on and/or turn-off operation of the specific unit buffers A, B, C. The CASCADE CONTROL input signal determines the direction of the cascade, namely whether the unit buffers selected by the ENABLE CASCADE signals shall be cascade-up or cascade-down. If desired, an additional DUAL CASCADE signal could also be provided to command cascade-up and cascade-down operation of the selected unit buffers.

The above-described control signals encompass modes wherein the unit buffers A, B, C are turned-on and are turned-off, sequentially or otherwise. However, another mode exists, namely wherein the unit buffers are enabled and coupled to the load buss ($C_L$), but it is desired to change the data without disabling unit buffer-buss communication. Understandably, enabling and disabling the buss takes time and power. In this he additional mode, the unit drivers are allowed to remain in the driven, enabled, state but the data is changed.

Figure 1A:
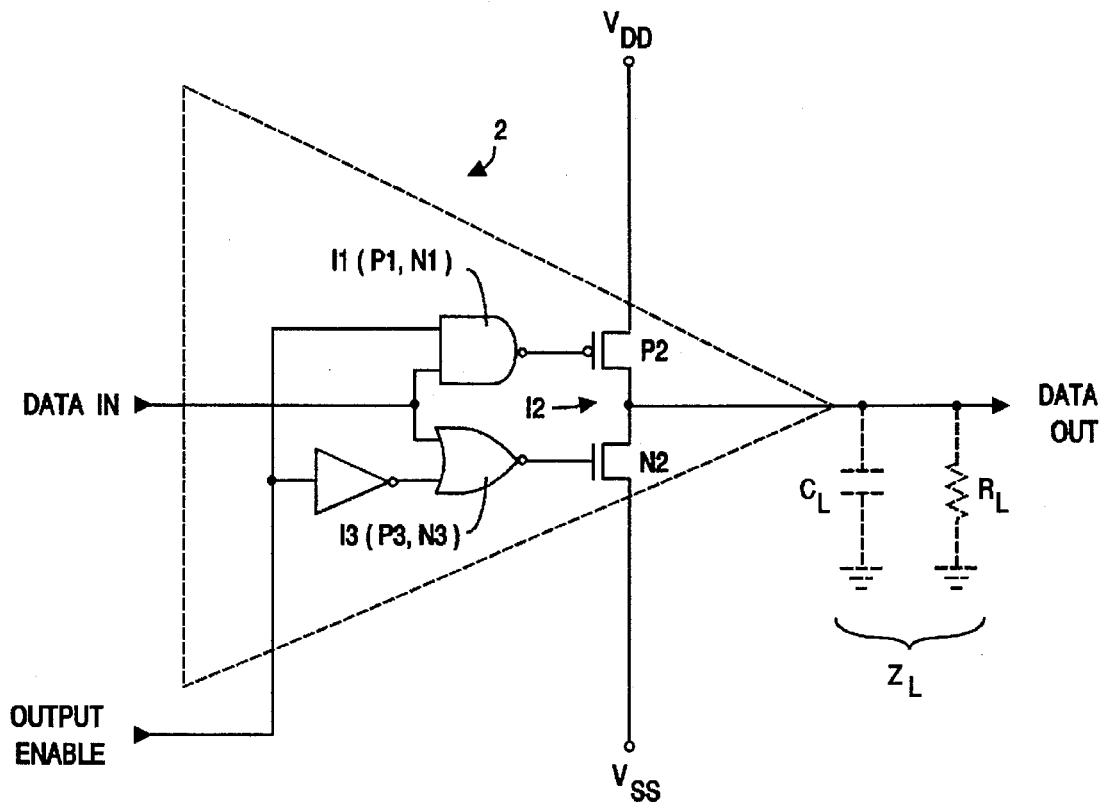
FIG. 1A is a generic depiction of an output buffer, according to the prior art.
Figure 1B:
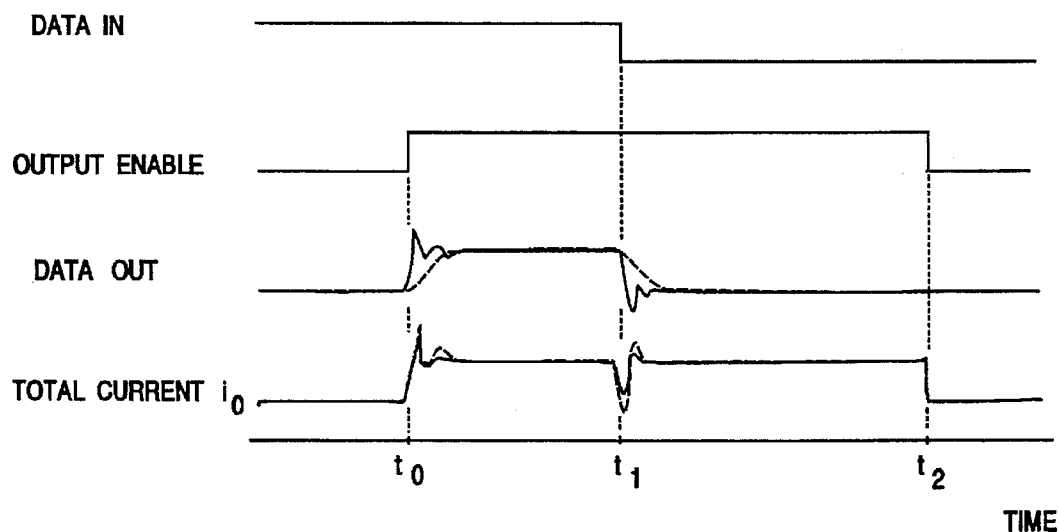
FIG. 1B depicts DATA IN, OUTPUT ENABLE, DATA OUT and total current waveforms associated with the buffer of FIG. 1A.
Figure 2A:
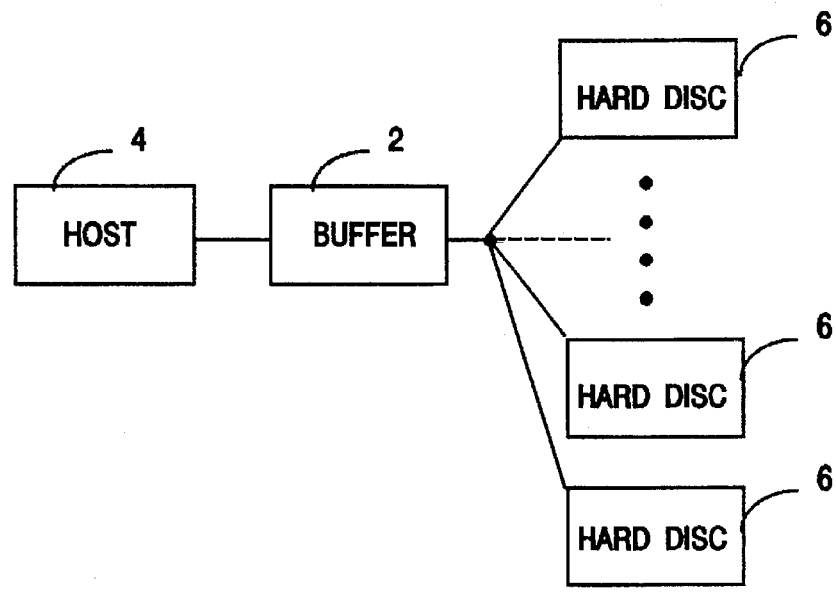
FIG. 2A shows a system wherein a host computer is coupled through a conventional buffer interface to one or more hard disc drive units, according to the prior art.
Figure 2B:
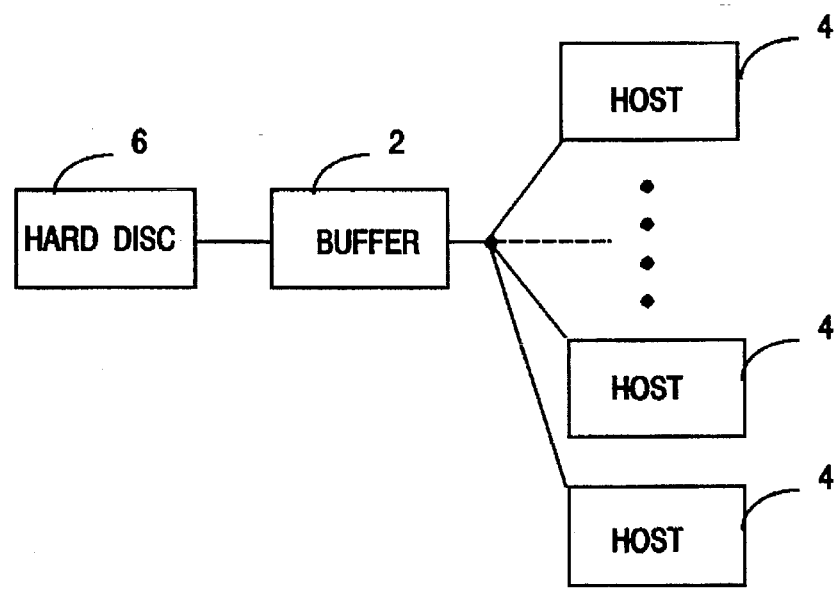
FIG. 2B shows a system wherein a hard disc drive unit is coupled through a conventional buffer interface to one or more host computers, according to the prior art.

However, it is clear from the $i_o$ waveform in FIG. 1B that simply changing the data while the unit buffers are enabled will create current spikes. It is the function of the RETRIGGER signal provided to driver control logic 32 to command a re-triggering of the sequence of cascading-on and/or cascading-off the unit buffers on every data change, before the data actually changes.

As shown in FIG. 5, various of the control signals to the driver control logic unit 32 preferably come from a register 34. Register 34 may be any output register associated with a microprocessor (not shown) available for use with the present invention. For example, when an output buffer 20 is used as an interface between a hard disc and a host computer, the register 34 will typically be available in association with the hard disc controller microprocessor. Frequency register 34 will be six-bits wide, and stores (preferably in latch-fashion) information written directly by the microprocessor. The WRITE ENABLE signal preferably is the address decode signal that latches register 34 when written to by the microprocessor.

In hard disc interface applications, the host computer can provide some information indicative of the type of capacitive load to be driven by the output buffer. For example, in a SCSI ("small computer system interface") environment, the host computer can determine the number of disc drives to be driven by a polling operation.

In other applications, the user may have some knowledge of the load to be driven. This information, however obtained, can be stored in a variety of ways, e.g., in a look-up table, in software, in read-only-memory ("ROM"), for use by the available microprocessor. The microprocessor output, communicated to register 34 via the microprocessor data bus, causes register 34 to store the proper signals that will be provided to the driver control logic 32. Thus, at system power-up, the microprocessor initializes the present invention, and causes the desired control signals to be stored into register 34.

Alternatively register 34 could be replaced by a system of hardwired switches, a diode matrix, or the like, wherein the user manually programs the various signals to be provided to driver control logic 32. A user having some knowledge about the relative magnitude of the load to be driven could refer, for example, to a chart and simply throw toggle switches to program various of the control signals into the driver control logic unit 32. For example, if a 5 m length of cable is to be driven, the switches would be manually set in one pattern, if a 15 m length of cable is to be driven, the switches would be set in another pattern, and so on.

Figure 6:
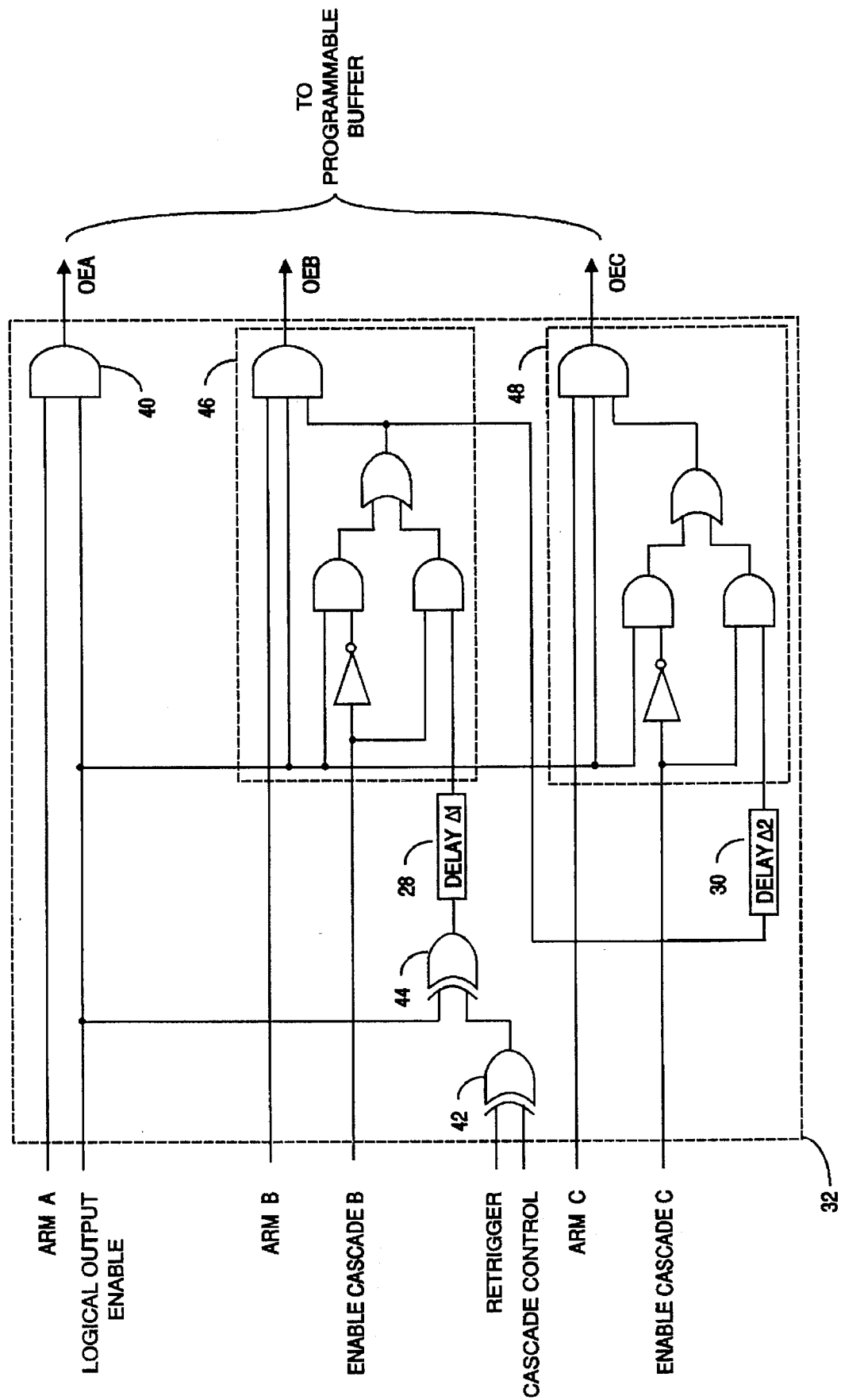
FIG. 6 is a simplified schematic diagram of one implementation of a driver control logic unit, according to the present invention.

FIG. 6 is a simplified schematic diagram of an embodiment of the driver control logic 32 wherein the enable signals provided to the unit buffers can cascade-up, cascade-down, and can also permit changing the data in the buffers without the current spiking shown for $i_o$ in FIG. 1B. NAND gate 40 will output an enabling OEA signal to unit buffer A whenever the LOGICAL OUTPUT ENABLE signal is high.

EXCLUSIVE OR gate 42 will output a "0" whenever the RETRIGGER and CASCADE CONTROL signals are both "1" or both "0", and will output "1" when these two signals are mismatched. When a match occurs, EXCLUSIVE OR gate 44 will output a "0" whenever the LOGICAL OUTPUT ENABLE signal is "0", or when there is a mismatch between the RETRIGGER and CASCADE CONTROL signals and when LOGICAL OUTPUT ENABLE="1". EXCLUSIVE OR gate 44 will otherwise output a "1".

The output signal from EXCLUSIVE OR gate 44 is delayed by element 28, and provided as an input to sublogic unit 46. Sublogic unit 46 will output an enabling OEB="1" to unit buffer B when the LOGICAL OUTPUT ENABLE signal and the ARM B signal are both "1", and the ENABLE CASCADE B signal is "0". When the cascade is not enabled (ENABLE CASCADE="0"), the various delays are effectively by-passed. Alternatively, OEB will be "1" if LOGICAL OUTPUT ENABLE and ARM B are both "1", and ENABLE CASCADE B="1" and the output of delay element 28 are also "1".

In similar fashion, sublogic unit 48 will output an enabling OEC="1" signal to unit buffer C when LOGICAL OUTPUT ENABLE="1", ARM C="1", and ENABLE CASCADE C and the output of delay element 30 are also "1".

The driver control logic 32 may of course be implemented differently, including an implementation permitting simultaneous cascade-up and cascade-down enablement of the unit buffers. In FIG. 6, delay elements 28 and 30 may but need not be similar to what was described with respect to time delay elements in FIG. 4.

Various combinations of ARM A, ARM B, ARM C, ENABLE CASCADE B, ENABLE CASCADE C, and CASCADE CONTROL signals will cause the programmable output buffer shown in FIG. 5 to operate in different modes. The design tradeoffs associated with these modes are depicted in TABLE 2, wherein it is assumed that unit buffers A, B and C are scaled to source/sink 4 mA, 8 mA and 12 mA current, respectively.

The second column in TABLE 2 depicts the relative power consumption for the programmable output buffer at start of enablement, with power consumption increasing as more unit buffers are activated to source/sink more current. The third and fourth columns of TABLE 2 indicate relative switching speed (e.g., dV/dt) and noise generation (e.g., current spiking) associated with the different modes.

The first row of data represents enablement of unit buffer A alone, a mode typified by low power consumption (due to the relatively low 4 mA current), low noise (due to the relatively low magnitude current spiking), but slow switching speed (due to i=c dV/dt current limitations).

The second row of data is similar to the first row except that after $\Delta 1$, unit buffer B is cascaded-on as well. Because two unit buffers, A and B, can now source/sink current, there is a speed improvement but as the cost of some increase in current spiking. The third row is similar to the second row, except that after an additional $\Delta t$, unit buffer C is also enabled. Speed increases because unit buffers A, B and C are cascaded-in, but some increase in current spiking and attendant noise will be present.

ing crosstalk, and improving transmission line characteristics associated with the output buffer.

Figure 7A:
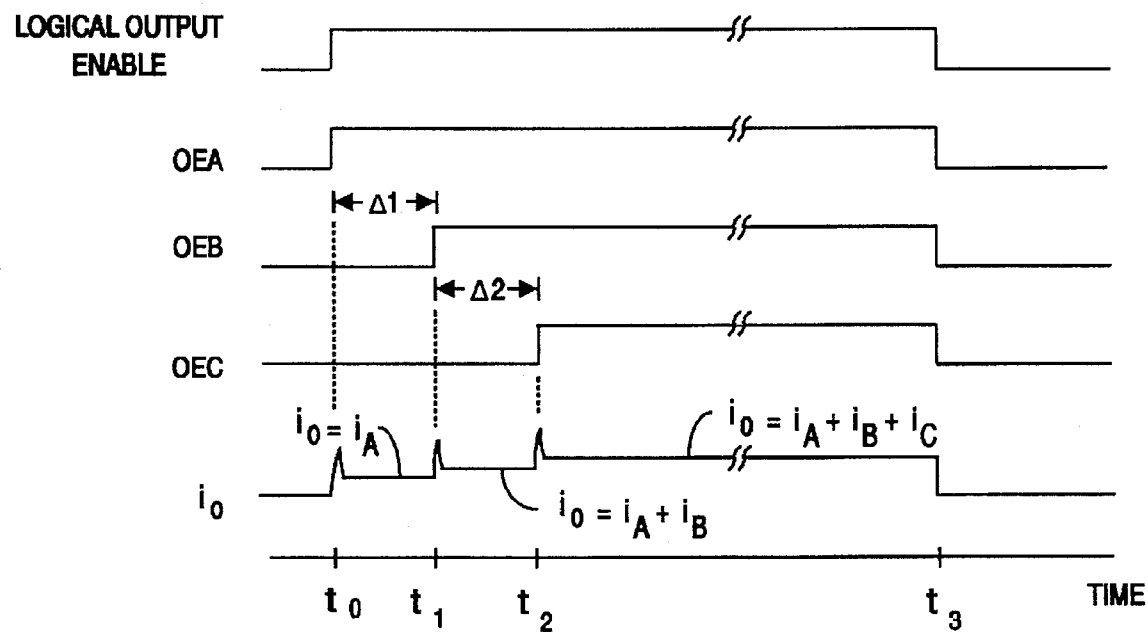
FIG. 7A depicts waveforms associated with a cascade-up, high power, low noise mode of operation for an output buffer, according to the present invention.

FIG. 7A depicts various voltage and current waveforms for an output buffer 20 programmed for cascade-up mode operation, for resultant high power and low noise performance. The first column in TABLE 2 identifies the various rows of data and is included solely for ease of reference in consulting the table.

With respect to TABLE 2, FIG. 7A represents row 16, wherein ARM A, ARM B, ARM C, ENABLE CASCADE B, ENABLE CASCADE C are "1", CASCADE CONTROL= "0", and additionally RETRIGGER="0". Before time $t_0$, the unit buffers will be in initialized states. At time $t_0$, OEA enables unit buffer A, and after a $\Delta 1$ time delay, OEB enables unit buffer B, and after an additional $\Delta 2$ time delay, OEC enables unit buffer C. As shown by the $i_o$ current waveform, at time to, the current capability of output buffer 20 is determined by unit buffer A, namely current iA. However at time $t_2$, unit buffer B is also activated, whereupon the current capability increases to $i_A+i_B$. At time $t_3$, unit buffer C also becomes activated, and the output buffer has current capability $i_o=i_A+i_B+i_C$.

An output buffer whose performance is characterized by FIG. 7A will have a slower turn-on time when compared with a conventional output buffer having instantaneously turn-on and turn-off characteristics. Further, rise and fall times on DATA OUT transitions will be slower compared to a conventional output buffer.

However, as shown by the $i_o$ current waveform in FIG. 7A, an output buffer according to the present invention will have lower amplitude current spikes, which spikes are distributed over time. As a result, there will be less detrimental effect upon the Vss and Vdd power supplies due to

TABLE 2

| | Selections | | | | Initialization Settings | | | | | |
|---|---|---|---|---|---|---|---|---|---|---|
| Row | Current A | Power | Speed | Noise | Cascade Control | Enable Cascade C | Enable Cascade B | ARM C | ARM B | ARM A |
| 1 | 4 | LOW | SLOW | LOW | 0 | 0 | 0 | 0 | 0 | 1 |
| 2 | 4 | LOW | NOMINAL | NOMINAL | 1 | 0 | 1 | 0 | 1 | 1 |
| 3 | 4 | LOW | FAST | HIGH | 1 | 1 | 1 | 1 | 1 | 1 |
| 4 | 8 | LOW | SLOW | LOW | 0 | 0 | 1 | 0 | 1 | 1 |
| 5 | 8 | LOW | NOMINAL | NOMINAL | 0 | 0 | 0 | 0 | 1 | 0 |
| 6 | 8 | LOW | FAST | HIGH | 1 | 1 | 1 | 1 | 1 | 0 |
| 7 | 12 | MEDIUM | SLOW | LOW | 0 | 0 | 1 | 0 | 1 | 1 |
| 8 | 12 | MEDIUM | NOMINAL | NOMINAL | 0 | 0 | 0 | 1 | 0 | 0 |
| 9 | 12 | MEDIUM | FAST | HIGH | 1 | 1 | 1 | 1 | 1 | 1 |
| 10 | 16 | MEDIUM | SLOW | LOW | 0 | 1 | 1 | 1 | 0 | 1 |
| 11 | 16 | MEDIUM | NOMINAL | NOMINAL | 0 | 0 | 0 | 1 | 0 | 1 |
| 12 | 16 | MEDIUM | FAST | HIGH | 1 | 1 | 1 | 1 | 1 | 1 |
| 13 | 20 | HIGH | SLOW | LOW | 0 | 1 | 1 | 1 | 1 | 0 |
| 14 | 20 | HIGH | NOMINAL | NOMINAL | 0 | 0 | 1 | 1 | 1 | 0 |
| 15 | 20 | HIGH | FAST | HIGH | 0 | 0 | 0 | 1 | 1 | 0 |
| 16 | 24 | HIGH | SLOW | LOW | 0 | 1 | 1 | 1 | 1 | 1 |
| 17 | 24 | HIGH | NOMINAL | NOMINAL | 0 | 0 | 1 | 1 | 1 | 1 |
| 18 | 24 | HIGH | FAST | HIGH | 0 | 0 | 0 | 1 | 1 | 1 |

It will be appreciated from TABLE 2 that an output buffer according to the present invention may be programmed to vary one or more output characteristics of the buffer. These characteristics can include, without limitation, minimizing the operating power consumed by the output buffer, reducing current spiking associated with the output buffer, reducing noise generation including EM/RF noise components, reducing output signal voltage undershoot/overshoot, reducthe reduced peak currents. By contrast, as suggested by FIG. 1B, a prior art output buffer will exhibit larger amplitude current spikes, with greater likelihood for generating RF noise, crosstalk and transmission line reflections.

Figure 7B:
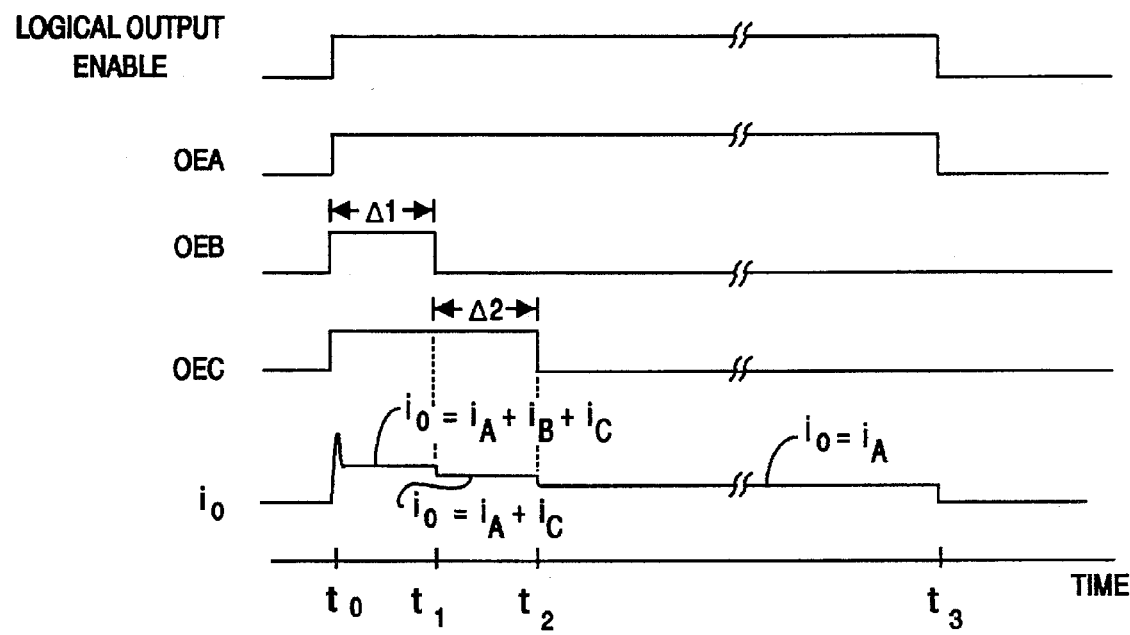
FIG. 7B depicts waveforms associated with a cascade-down, low power, high speed mode of operation for an output buffer, according to the present invention.

FIG. 7B depicts various voltage and current waveforms for an output buffer 20 programmed for cascade-down mode operation, for resultant low power and high speed performance. With respect to TABLE 2, FIG. 7B represents row 3, wherein ARM A, ARM B, ARM C, ENABLE CASCADE B, ENABLE CASCADE C and CASCADE CONTROL are "1", and additionally RETRIGGER="0".

At time $t_0$, OEA, OEB, OEC simultaneously enable their respective unit buffers A, B, C. Previous to this time, the unit buffers are in initialized states, and $i_o$ for output buffer 20 is zero.

As shown by the $i_o$ current waveform, this simultaneous activation of the unit buffers will result in a large current spike at time $t_0$, whereafter the steady state source/sink current for the output buffer is $i_o=i_A+i_B+i_C$. However after Δ1, at time $t_1$ OEB changes to a "0", disabling unit buffer B from further contribution to the source/sink current capability of the output buffer, which will now be $i_o=i_A+i_C$. After Δ2, at time $t_2$ OEC is changes to a "0",, which disables unit buffer C, whereafter $i_o=i_A$. Finally, at time $t_3$, LOGICAL OUTPUT ENABLE changes to a "0" and OEA becomes "0", disabling unit buffer A, whereupon $i_o$=zero.

Compared to a prior art instantaneous turn-on, turn-off buffer, an output buffer according to the present invention configured for the cascade-down performance shown in FIG. 7B will consume less power while still providing fast switching with fast rise and fall times. However, as shown by the $i_o$ current waveform, this increase in performance is at the expense of increased current spike noise.

Figure 8:
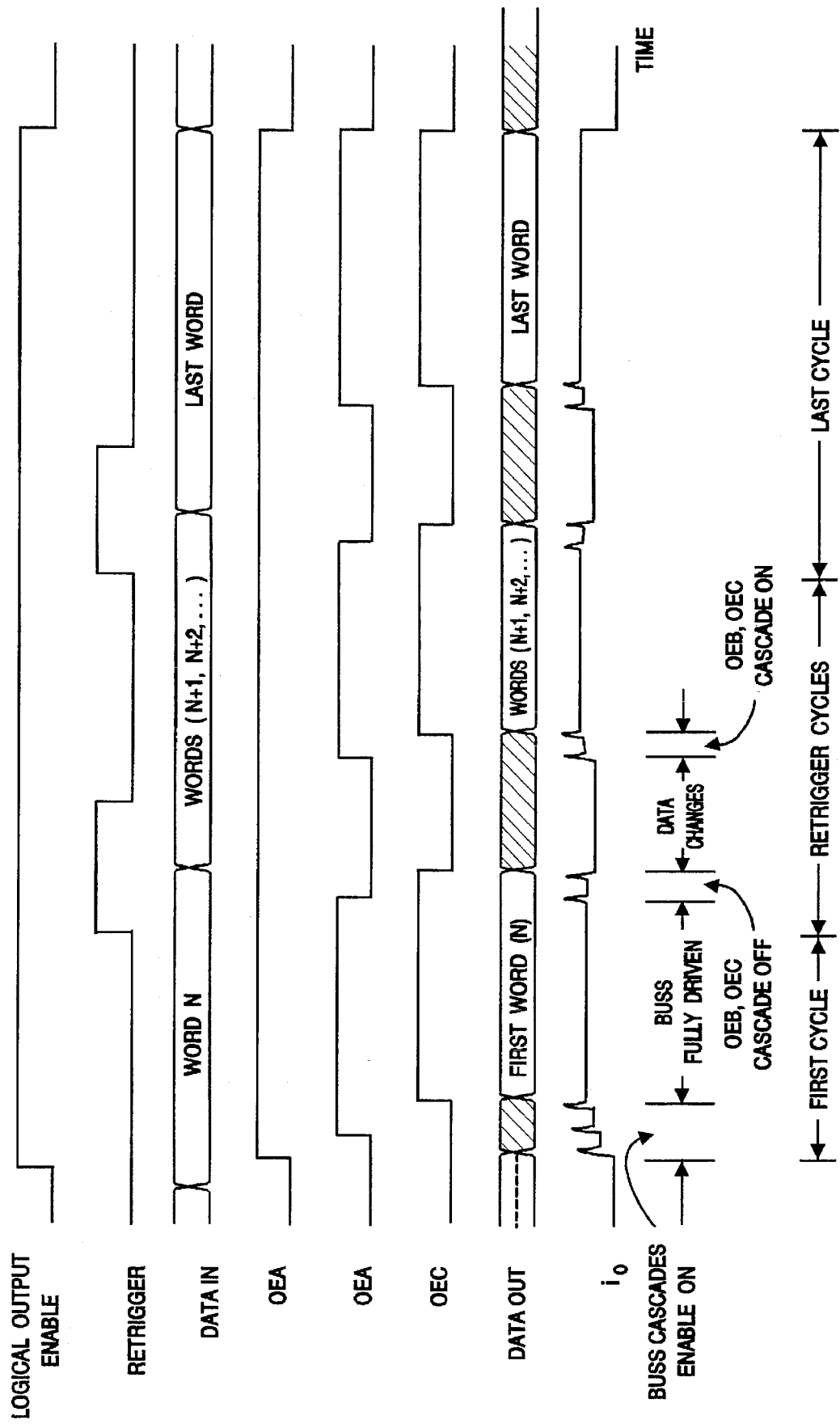
FIG. 8 depicts waveforms associated with a cascade-enabled, high power, low-noise mode of operation with DATA IN changing, for an output buffer according to the present invention.

FIG. 8 is somewhat similar to FIG. 7A in that the configuration of data row 16 in TABLE 2 is depicted, however FIG. 8 also depicts DATA IN changing on an enabled buss. Similar to what was shown in FIG. 7A, the output buffer current $i_o$ sequentially cascades-on, and very shortly after OEC="1", $i_o=i_A+i_B+i_C$, whereupon the buss load is fully driven.

Thus far, RETRIGGER has been "0" and the above-described sequence may be referred to as a first cascade cycle. When RETRIGGER="1", a retrigger cycle begins, and in FIG. 8, OEB and OEC are sequentially cascaded-off. Thereafter, as shown, DATA IN changes, whereafter OEB and OEC are sequentially cascaded-on, whereupon once again $i_o=i_A+i_B+i_C$. In this fashion, the cascade-on/cascade-off sequence is retriggered for every data change, before the data in the unit buffers actually changes.

This "retriggering" of the cascade-on/cascade-off sequence for an enabled buss prevents the output buffer from responding as a single unit buffer, as described with respect to FIG. 1A. Instead of simultaneously switching currents, the transitions are cascaded as though they represented an initial case.

Figure 9:
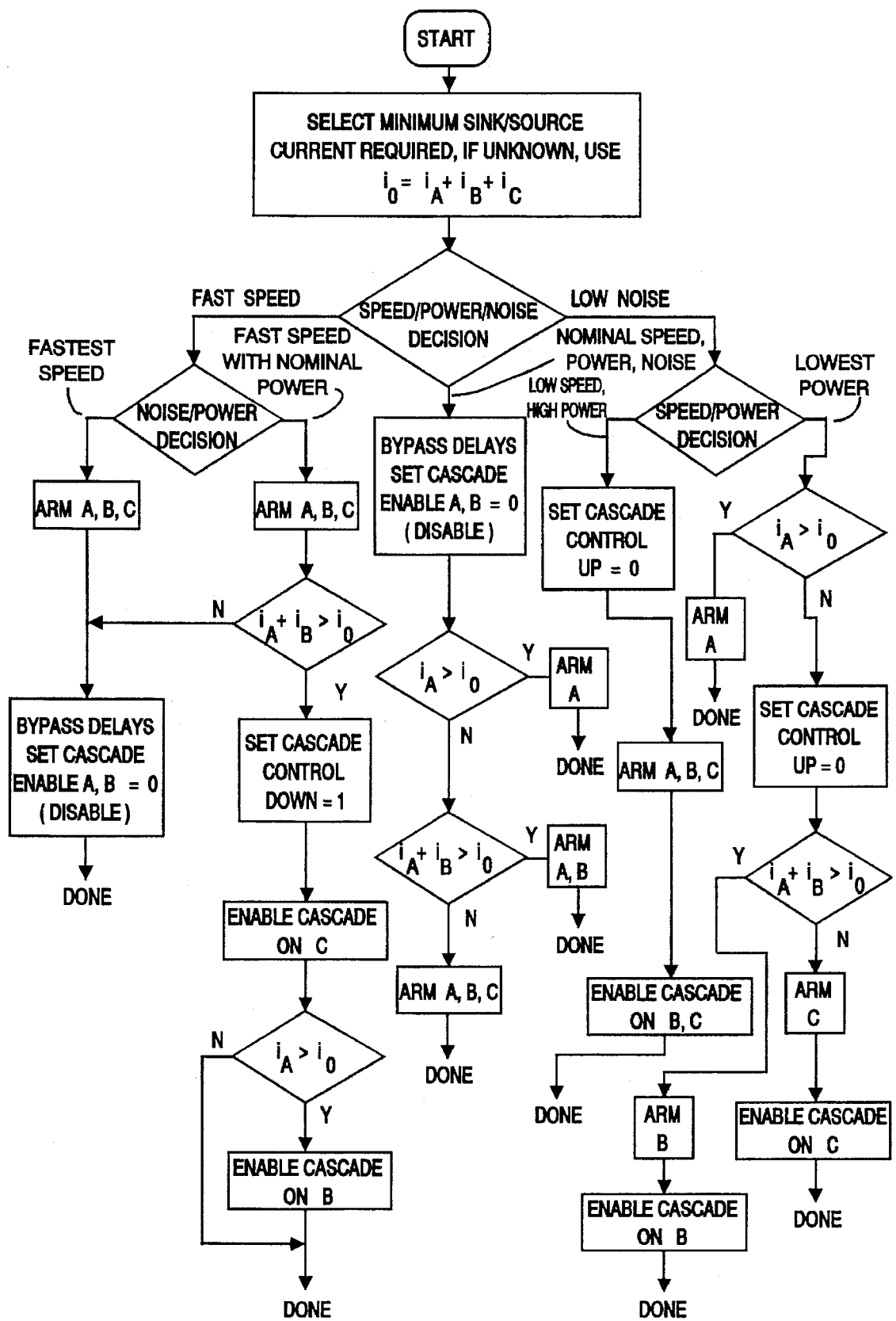
FIG. 9 is a flowchart depicting programming options available for controlling characteristics of an output buffer according to the present invention.

FIG. 9 is a flow chart representing the methodology of the present invention, wherein a programmable output buffer comprises three unit buffers A, B, C. The method steps in FIG. 9 are self-explanatory, and essentially depict how the output buffer configuration design considerations set forth in TABLE 2 may be arrived at.

A routine enabling the method steps of FIG. 9 may be implemented in software, firmware, hardware, or a combination of each. The microprocessor referred to in FIG. 5 (and depicted as element 100 in FIGS. 10A, 10B) may be used to execute the program, which could be stored in associated memory. Alternatively, the various design decisions could be manually implemented. For example, a user might know that a large capacitive load will be driven by the output buffer, and that for the application at hand, speed is more important than power or noise consideration. In such instance, FIG. 9 suggests that ARM A, B, C will all be activated, and that neither delays nor cascading will be used. Other configuration scenarios are readily apparent from FIG. 9 and/or TABLE 2.

Figure 10A:
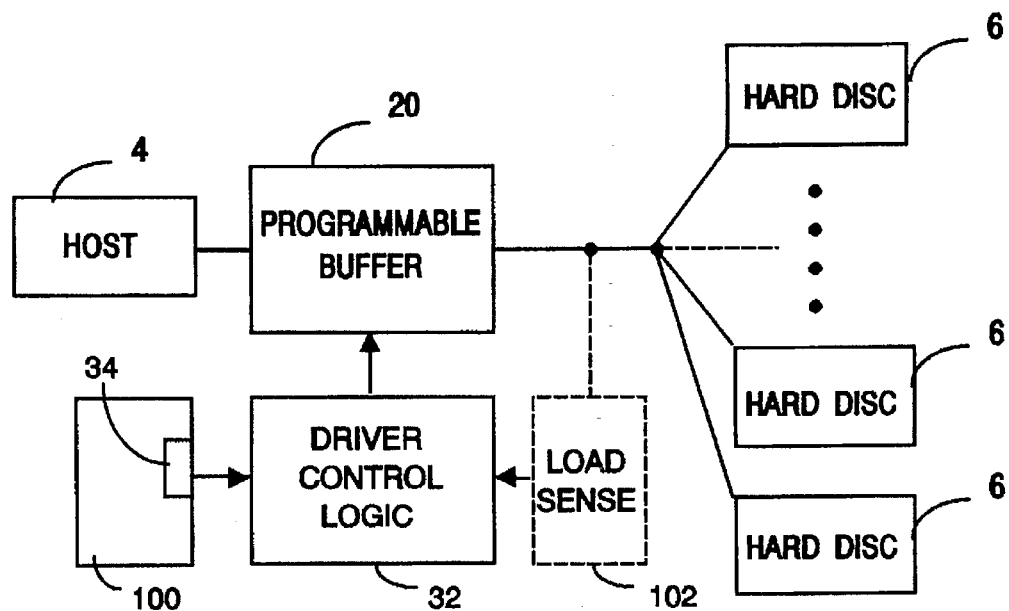
FIG. 10A depicts an output buffer used to interface between a host system and a plurality of hard disc drives, with optional load sense, according to the present invention.
Figure 10B:
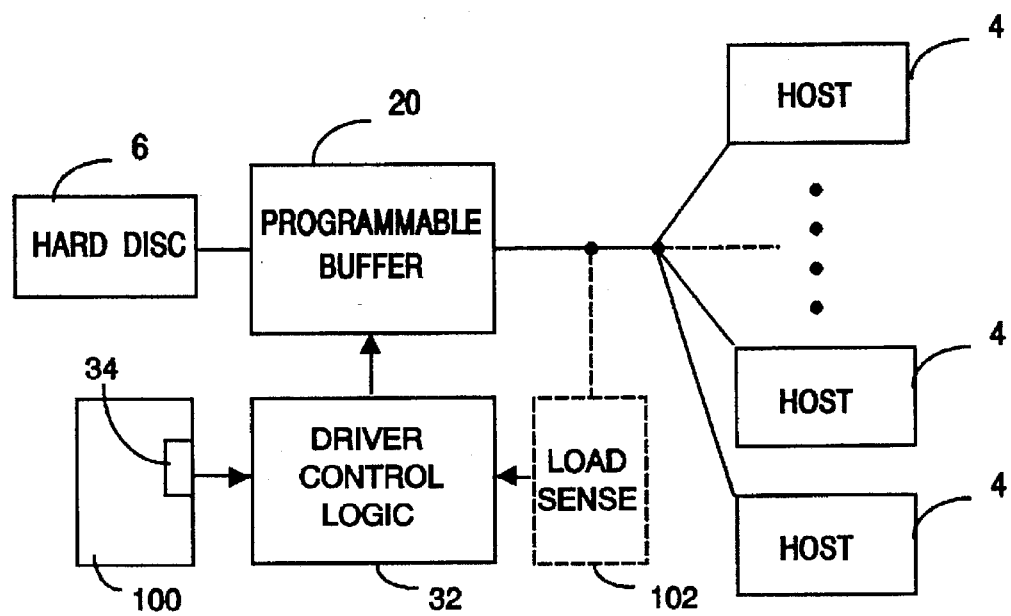
FIG. 10B depicts an output buffer used to interface between a hard disc drive and a plurality of hosts, with optional load sense, according to the present invention.

Those skilled in the art will appreciate that the present invention may be used in any application wherein an output buffer is called upon to drive different loads. However, FIGS. 10A and 10B depict a preferred embodiment, wherein the present invention is used as an interface between one or more host computers 4 and one or more hard disc units 6. In FIGS. 10A, 10B, elements 100 and 34 respectively depict a microprocessor and associated register that may be used to program driver control logic 32 and the associated programmable buffer 20. Such use of a microprocessor and register were described with reference to FIG. 5.

If desired, a load sense element 102 may be provided to sense the capacitive load $C_L$ coupled to the output of the programmable buffer 20. In computer systems wherein SCSI-compatible hard disc units, e.g., units 6, are driven by a host computer (e.g., 4), a polling function is available to indicate how many hard disc units are present. Using this polling information, load sense 102 and microprocessor 100 can collectively program the driver control logic. For example, if polling indicates three hard disc units are present, information available to microprocessor 100, perhaps from an associated look-up table, could determine the desired programming mode to be implemented for output buffer 20. Such programming could include the number of unit buffers to be used, the type of cascading, if any, to be used, and so forth.

In applications wherein polling or the equivalent function does not normally exist, load sense 102 could include circuitry to approximate the effective $C_L$ to be driven. Load sense 102 could, for example, include a constant reference current source $I_{REF}$ and a voltage sense circuit. Since the voltage v(t) developed across $C_L$ due to $I_{REF}$ will be:

$$v(t) = \frac{I_{REF}}{C_L} \cdot \int dt$$

$C_L$ may be determined by the magnitude of v(t) developed in a given amount of time. Of course, other methods for sensing $C_L$ are also possible.

Other features and advantages of the invention will appear from the following description in which the preferred embodiments have been set forth in detail, in conjunction with the accompanying drawings. Modifications and variations may be made to the disclosed embodiments without departing from the subject and spirit of the invention as defined by the following claims.

What is claimed is:

1. An output buffer with programmable output characteristics for interfacing with a hard disc drive unit, comprising:

a first enableable unit buffer;

a second enableable unit buffer;

wherein each said enableable unit buffer has an input node, an output node, and an enabling node, each said enableable unit buffer input node being coupled together to form an output buffer input node that is coupleable to a data input signal, and each said unit enableable buffer output node being coupled together to form an output buffer output node providing a data output signal coupleable to a load impedance;

wherein each said enableable unit buffer can source and sink at least a portion of output current sourced and sunk by said output buffer; and computer implemented program means for providing a first enable control signal, coupled to the enabling node on said first enableable unit buffer, and further providing a second enable control signal coupled to the enabling node on said second enableable unit buffer;

wherein said program means causes chosen combinations of said first enableable unit buffer and said second enableable unit buffer to be enabled to vary at least one output characteristic of said output buffer selected from the group consisting of (a) minimizing operating power consumed by said output buffer, (b) reducing current spiking associated with said output buffer, (c) reducing noise radiation associated with said output buffer, (d) reducing voltage overshoot/undershoot associated with said data output signal provided by said output buffer, (e) reducing crosstalk associated with said output buffer, and (f) improving transmission line characteristics associated with said output buffer.

2. The output buffer of claim 1, wherein each said enableable unit buffer can source and sink substantially identical amounts of current.

3. The output buffer of claim 1, wherein said second enableable unit buffer includes output transistors sized to source and sink more current than can be sourced or sunk by output transistors in said first enableable unit buffer.

4. The output buffer of claim 1, wherein said first enableable unit buffer includes a first number of parallel-coupled pull-up and pull-down transistors, and wherein said second enableable unit buffer includes a second number of parallel-coupled pull-up and pull-down transistors, wherein said first number is selected from the group consisting of (a) a number equal to said second number, (b) a number less than said second number, and (c) a number greater than said second number.

5. The output buffer of claim 1, wherein said program means includes means for delaying at least said second enabling control signal relative to said first enabling control signal.

6. The output buffer of claim 1, wherein said program means includes means for storing a pattern of the first and second enable control signals, which pattern programs said output buffer to source and sink a magnitude of current appropriate for a said load impedance coupled to said output node of said output buffer.

7. The output buffer of claim 1, further including sense means for sensing a said load impedance coupled to said output node of said output buffer, and for providing said program means with at least one signal proportional to the sensed said load impedance;

wherein said program means provides control signals causing said output buffer to source and sink current commensurate with said sensed load impedance.

8. The output buffer of claim 1, wherein said load impedance represents at least one load selected from the group consisting of (a) at least one hard disc drive unit, wherein said data input is provided by a host computer, (b) a buss cable coupled to at least one hard disc drive unit, wherein said data input signal is provided by a host computer, (c) at least one host computer, wherein said data input signal is provided by a hard disc drive unit, and (d) a buss cable coupled to at least one host computer, wherein said data input signal is provided by a hard disc drive unit.

9. The output buffer of claim 1, wherein said program means includes cascade means for controllably operating said first enableable unit buffer and said second enableable unit buffer in at least one mode selected from the group consisting of (a) enabling each said enableable unit buffer substantially simultaneously upon start of a said control signal, (b) enabling each said enableable unit buffer sequentially upon start of a said control signal, (c) disabling each said enableable unit buffer substantially simultaneously upon termination of a said control signal, and (d) disabling each said enableable unit buffer sequentially upon termination of a said control signal.

10. The output buffer of claim 9, wherein said program means includes retrigger means for retriggering a sequence of signals from said cascade means upon each state change of said data input signal coupled to said input node of said output buffer.

11. A method of providing a hard disc drive unit interfacing output buffer with programmable output characteristics, the method comprising the following steps:

providing a first enableable unit buffer and a second enableable unit buffer;

wherein each said enableable unit buffer has an input node, an output node, and an enabling node, each said enableable unit buffer input node being coupled together to form an output buffer input node that is coupleable to a data input signal, and each said enableable unit buffer output node being coupled together to form an output buffer output node providing a data output signal coupleable to a load impedance;

wherein each said enableable unit buffer can source and sink at least a portion of output current sourced and sunk by said output buffer; and providing program means for providing a first enable control signal, coupled to the enabling node on said first enableable unit buffer, and further providing a second enable control signal coupled to the enabling node on said second enableable unit buffer;

wherein said program means causes chosen combinations of said first enableable unit buffer and said second enableable unit buffer to be enabled to vary at least one output characteristic of said output buffer selected from the group consisting of (a) minimizing operating power consumed by said output buffer, (b) reducing current spiking associated with said output buffer, (c) reducing noise radiation associated with said output buffer, (d) reducing voltage overshoot/undershoot associated with said data output signal provided by said output buffer, (e) reducing crosstalk associated with said output buffer, and (f) improving transmission line characteristics associated with said output buffer.

12. The method of claim 11, wherein each said enableable unit buffer can source and sink substantially identical amounts of current.

13. The method of claim 11, wherein said second enableable unit buffer includes output transistors sized to source and sink more current than can be sourced or sunk by output transistors in said first enableable unit buffer.

14. The method of claim 11, wherein said first enableable unit buffer includes a first number of parallel-coupled pull-up and pull-down transistors, and wherein said second enableable unit buffer includes a second number of parallel-coupled pull-up and pull-down transistors, wherein said first number is selected from the group consisting of (a) a number equal to said second number, (b) a number less than said second number, and (c) a number greater than said second number.

15. The method of claim 11, wherein said program means includes means for delaying at least said second enabling control signal relative to said first enabling control signal.

16. The method of claim 11, wherein said program means includes means for storing a pattern of the first and second control signals, which pattern programs said output buffer to source and sink a magnitude of current appropriate for a said load impedance coupled to said output node of said output buffer.

17. The method of claim 11, including the further step of providing sense means for sensing a said load impedance coupled to said output node of said output buffer, and for providing said program means with at least one signal proportional to the sensed said load impedance;

wherein said program means provides control signals causing said output buffer to source and sink current commensurate with said sensed load impedance.

18. The method of claim 11, wherein said load impedance represents at least one load selected from the group consisting of (a) at least one hard disc drive unit, wherein said data input is provided by a host computer, (b) a buss cable coupled to at least one hard disc drive unit, wherein said data input signal is provided by a host computer, (c) at least one host computer, wherein said data input signal is provided by a hard disc drive unit, and (d) a buss cable coupled to at least one host computer, wherein said data input signal is provided by a hard disc drive unit.

19. The method of claim 11, wherein said program means includes cascade means for controllably operating said first enableable unit buffer and said second enableable unit buffer in at least one mode selected from the group consisting of (a) enabling each said enableable unit buffer substantially simultaneously upon start of a said control signal, (b) enabling each said enableable unit buffer sequentially upon start of a said control signal, (c) disabling each said enableable unit buffer substantially simultaneously upon termination of a said control signal, and (d) disabling each said enableable unit buffer sequentially upon termination of a said control signal.

20. The method of claim 19, wherein said program means includes retrigger means for retriggering a sequence of signals from said cascade means upon each state change of said data input signal coupled to said input node of said output buffer.

* * * * *